United States Patent
You et al.

(10) Patent No.: US 11,558,045 B1
(45) Date of Patent: Jan. 17, 2023

(54) PHASE ROTATOR

(71) Applicant: International Business Machines Corporation, Armonk, NY (US)

(72) Inventors: Yang You, Austin, TX (US); Venkat Harish Nammi, Austin, TX (US); Pier Andrea Francese, Adliswil (CH); Chad Andrew Marquart, Austin, TX (US); Glen A. Wiedemeier, Austin, TX (US); Daniel M. Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/362,553

(22) Filed: Jun. 29, 2021

(51) Int. Cl.
*H03K 5/131* (2014.01)
*H03K 5/135* (2006.01)
*H03K 5/00* (2006.01)

(52) U.S. Cl.
CPC ............. *H03K 5/131* (2013.01); *H03K 5/135* (2013.01); *H03K 2005/00058* (2013.01); *H03K 2005/00286* (2013.01)

(58) Field of Classification Search
None
See application file for complete search history.

(56) References Cited

U.S. PATENT DOCUMENTS

| | | | |
|---|---|---|---|
| 7,994,837 B1 * | 8/2011 | Ho | H03H 11/22 327/233 |
| 8,218,705 B2 | 7/2012 | Yousefi Moghaddam et al. | |
| 8,427,217 B1 | 4/2013 | Le Grand de Mercey et al. | |
| 8,774,336 B2 | 7/2014 | Bae et al. | |
| 8,873,689 B2 | 10/2014 | Chung et al. | |
| 9,350,528 B2 | 5/2016 | Song | |
| 9,485,084 B2 * | 11/2016 | Sun | H03L 7/099 |
| 9,991,848 B1 * | 6/2018 | Francese | H03D 7/1441 |
| 10,142,090 B1 * | 11/2018 | Cevrero | H04B 1/40 |
| 10,483,956 B2 | 11/2019 | Tsuji | |
| 10,560,097 B1 | 2/2020 | Peng et al. | |

FOREIGN PATENT DOCUMENTS

WO 2020176433 A1 9/2020

OTHER PUBLICATIONS

Almer et al., "A 14mW 6.25Gb/s Transceiver in 90nm CMOS for Serial Chip-to-Chip Communications," ISSCC 2007 | Session 24 | Multi-GB/s Transceivers/24.3, 3 pages.

(Continued)

*Primary Examiner* — Cassandra F Cox
(74) *Attorney, Agent, or Firm* — Patterson + Sheridan, LLP

(57) ABSTRACT

A method includes connecting inputs of a first plurality of interpolation branches to a first clock signal, connecting inputs of a second plurality of interpolation branches to a second clock signal, and connecting inputs of a third plurality of interpolation branches to a third clock signal. The method also includes combining outputs of the first plurality of interpolation branches, the second plurality of interpolation branches, and the third plurality of interpolation branches to produce an output clock signal and adjusting a phase of the output clock signal by connecting an input of an interpolation branch of the third plurality of interpolation branches to the second clock signal.

19 Claims, 6 Drawing Sheets

(56) References Cited

OTHER PUBLICATIONS

Zhang et al., "A28 GB/s Multistandard Serial Link Transceiver for Backplane Applications in 28 nm CMOS," IEEE Journal of Solid-State Circuits, vol. 50, No. 12, Dec. 2015, 12 pages.
Cevrero et al., "A 60 GB/s 1.9 pJ/bit NRZ Optical-Receiver with Low Latency Digital CDR in 14nm CMOS FinFET," 2017 Symposium on VLSI Circuits Digest of Technical Papers, 2 pages.

* cited by examiner

PHASE ROTATOR

BACKGROUND

The present invention relates to adjusting the phases of signals, and more specifically, to a phase rotator that adjusts signal phases.

SUMMARY

According to an embodiment, a method includes connecting inputs of a first plurality of interpolation branches to a first clock signal, connecting inputs of a second plurality of interpolation branches to a second clock signal, and connecting inputs of a third plurality of interpolation branches to a third clock signal. The method also includes combining outputs of the first plurality of interpolation branches, the second plurality of interpolation branches, and the third plurality of interpolation branches to produce an output clock signal and adjusting a phase of the output clock signal by connecting an input of an interpolation branch of the third plurality of interpolation branches to the second clock signal.

According to another embodiment, a phase rotator includes a first plurality of interpolation branches, a first selector circuit, a second plurality of interpolation branches, a third plurality of interpolation branches, and a second selector circuit. The first selector circuit is connected to the first plurality of interpolation branches. The first selector circuit connects inputs of the first plurality of interpolation branches to a first clock signal. The second selector circuit is connected to the second plurality of interpolation branches and the third plurality of interpolation branches. The second selector connects inputs of the second plurality of interpolation branches to a second clock signal and connects inputs of the third plurality of interpolation branches to a third clock signal. Outputs of the first plurality of interpolation branches, the second plurality of interpolation branches, and the third plurality of interpolation branches are combined to produce an output clock signal. The second selector circuit further adjusts a phase of the output clock signal by connecting an input of an interpolation branch of the third plurality of interpolation branches to the second clock signal.

According to another embodiment, a method includes determining a phase for an output clock signal and setting control bits based on the phase for the output clock signal. Inputs of a first plurality of interpolation branches are connected to a first clock signal based on the control bits. Inputs of a second plurality of interpolation branches are connected to a second clock signal based on the control bits. Inputs of a third plurality of interpolation branches are connected to a third clock signal based on the control bits. Outputs of the first plurality of interpolation branches, the second plurality of interpolation branches, and the third plurality of interpolation branches are combined to produce the output clock signal with the determined phase.

DETAILED DESCRIPTION

Phase rotators may be used to adjust the phases of signals (e.g., to rotate the phases of clock signals). For example, phase rotators may combine signals of different phases to produce an output of a desired phase. Conventional phase rotators produce an output signal by fixing input signals with different phases to each one's dedicated interpolation branch in the phase rotator. The conventional phase rotators adjust or rotate the phase of the output signal by adjusting which of the different interpolation branches (and as a result, the fixed input signals) are used to generate the output signal. Therefore, different output phases use a different set of active interpolation branches. The interpolation branches, however, may be mismatched due to manufacturer variation, asymmetric layout design, and/or mechanical stress. This mismatch reduces the linearity of the phase rotator, which degrades the accuracy and/or precision of the phase adjustment.

This disclosure describes a phase rotator that produces an output signal by connecting input signals to interpolation branches. Each individual interpolation branch's input can be switched to any input phases. The phase rotator adjusts the phase of the output signal by disconnecting an input signal from an interpolation branch and then connecting another input signal to that interpolation branch. In this manner, the same set of active interpolation branches are used for the different output phases (phase adjustments), which reduces or avoids the impact of mismatches. As a result, the linearity of the phase rotator is improved over conventional designs, in particular embodiments.

Figure 1:
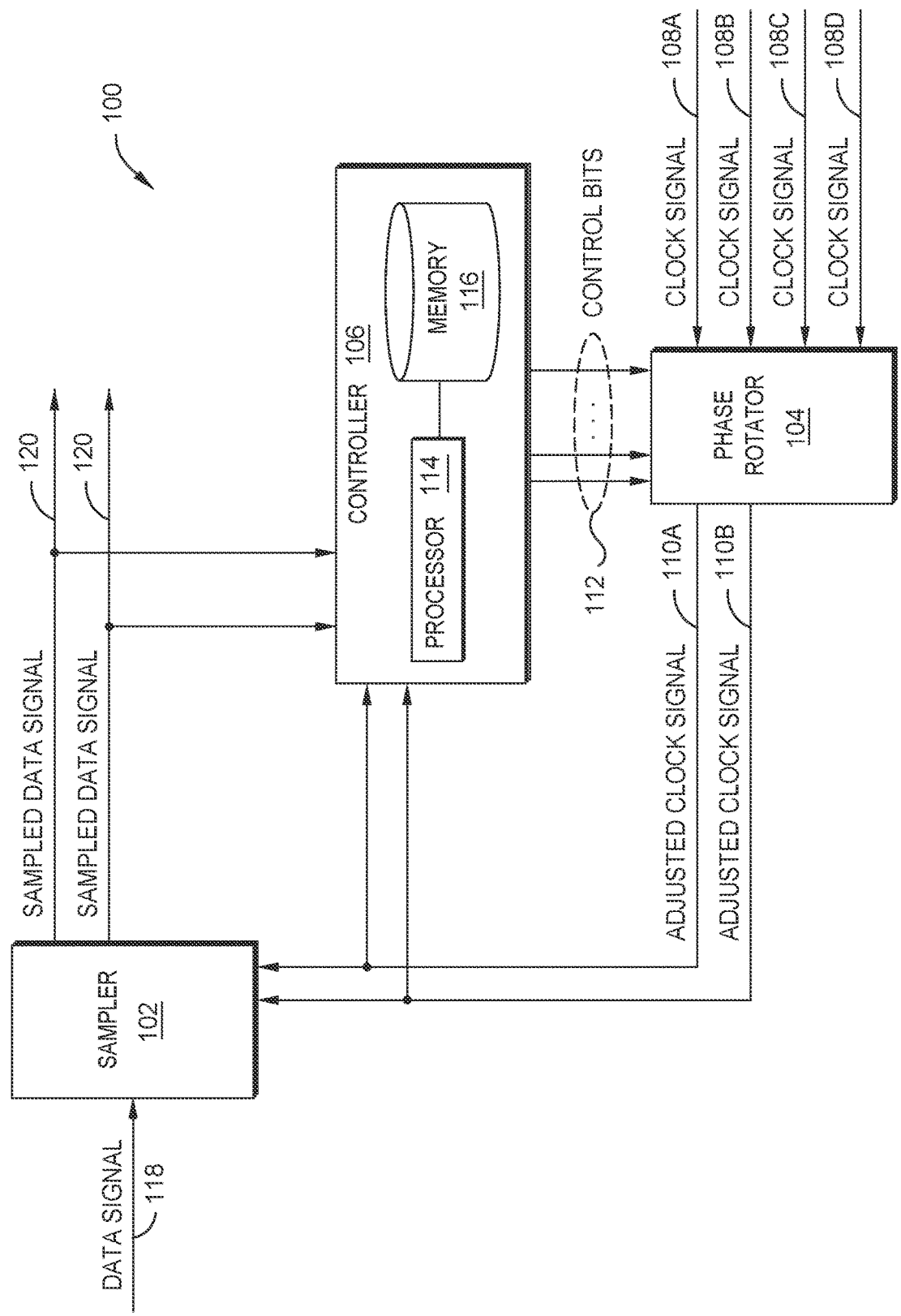
FIG. 1 illustrates an example system.

FIG. 1 illustrates an example system 100. As seen in FIG. 1, the system 100 includes a sampler 102, a phase rotator 104, and a controller 106. Generally, the sampler 102 samples a data signal according to one or more clock signals provided to the sampler 102. The phase rotator 104 and the controller 106 work together to adjust a phase of one or more clock signals. In particular embodiments, the phase rotator 104 and/or the controller 106 adjust or rotate the phase of a clock signal by changing the clock signals that are connected to a same set of active interpolation branches. The phase rotator 104 provides the adjusted clock signals to the sampler 102.

The sampler 102 samples a data signal 118 to produce one or more sampled data signals 120. The sampler 102 samples the data signal 118 according to one or more received clock signals. For example, the sampler 102 may sample the data signal 118 on edges (e.g., rising or falling edges) of a received clock signal to produce a sampled data signal 120. The sampler 102 may produce a sampled data signal 120 for each received clock signal. If the received clock signals have different phases, then the sampled data signals 120 may be staggered in time based on the phase differences between or amongst the received clock signals. The sampled data signals 120 may then be combined to produce a representation of the data signal 118. For example, the sampled data signals 120 may be combined to produce a digital representation of the data signal 118. The sampler 102 may sample the data signal 118 according to any number of clock signals to produce any number of sampled data signals 120.

The phase differences between or amongst the received clock signals may be controlled or coordinated, such that the sampler 102 samples the data signal 118 at particular points in time. For example, the received clock signals may be controlled or coordinated, such that the received clock signals are 90 degrees out of phase. The sampler 102 then samples the data signal 118 during the rising or falling edges of the received clock signals. Due to the controlled phase differences between or amongst the received clock signals, the sampler 102 samples the data signal 118 at particular points in time to produce the sampled data signals 120.

The phase rotator 104 and the controller 106 operate together to adjust or rotate the phases of received clock signals 108. The phase rotator 104 produces one or more adjusted clock signals 110 that are then communicated to the sampler 102. The sampler 102 then samples the data signal 118 according to the adjusted clock signals 110. The phase rotator 104 and the controller 106 may adjust or rotate the phases of the one or more clock signals 108 based on the sampled data signals 120 to correct phase errors for the clock signals 108. In this manner, the adjusted clock signals 110 have corrected phases so that the sampler 102 samples the data signal 118 at the appropriate times, in particular embodiments.

The phase rotator 104 receives one or more clock signals 108. In the example of FIG. 1, the phase rotator 104 receives clock signals 108A, 108B, 108C, and 108D. The clock signals 108 may have been generated by a clock generation circuit and may have different phases. For example, the clock signals 108A, 108B, 108C, and 108D may have a 0 degree phase, a 90 degree phase, a 180 degree phase, and a 270 degree phase, respectively. Generally, the phase rotator 104 produces an adjusted clock signal 110 with a particular phase by connecting the clock signals 108 to interpolation branches in the phase rotator 104. By changing which clock signals 108 are connected to a same set of active interpolation branches, the phase rotator 104 adjusts the contribution of each clock signal 108 to the phase of the adjusted clock signal 110.

The controller 106 receives the sampled data signals 120 and detects the phases of the sampling clock signals 110. The controller 106 then determines if the phases of the adjusted sampling clock signals 110 are appropriate (e.g., determining whether the data signal 118 is sampled at particular times). The controller 106 then generates control bits 112 that are communicated to the phase rotator 104. The phase rotator 104 then interprets the control bits 112 to adjust the phases of one or more adjusted clock signals 110 by changing which clock signals 108 are connected to a same set of active interpolation branches in the phase rotator 104. For example, the controller 106 may determine that the phase of the adjusted clock signal 110A should be rotated fifteen degrees. The controller 106 then adjusts the control bits 112 so that the phase rotator 104 changes connections between some of the clock signals 108 and the same set of active interpolation branches in the phase rotator 104 to rotate the phase of the adjusted clock signal 110A by fifteen degrees. As seen in FIG. 1, the controller 106 includes a processor 114 and a memory 116, which are configured to perform any of the functions of the controller 106 described herein.

The processor 114 is any electronic circuitry, including, but not limited to one or a combination of microprocessors, microcontrollers, application specific integrated circuits (ASIC), application specific instruction set processor (ASIP), and/or state machines, that communicatively couples to memory 116 and controls the operation of the controller 106. The processor 114 may be 8-bit, 16-bit, 32-bit, 64-bit or of any other suitable architecture. The processor 114 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor 114 may include other hardware that operates software to control and process information. The processor 114 executes software stored on the memory 116 to perform any of the functions described herein. The processor 114 controls the operation and administration of the controller 106 by processing information (e.g., information received from the phase rotator 104 and the memory 116). The processor 114 is not limited to a single processing device and may encompass multiple processing devices.

The memory 116 may store, either permanently or temporarily, data, operational software, or other information for the processor 114. The memory 116 may include any one or a combination of volatile or non-volatile local or remote devices suitable for storing information. For example, the memory 116 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 116, a disk, a CD, or a flash drive. In particular embodiments, the software may include an application executable by the processor 114 to perform one or more of the functions described herein.

Figure 2:
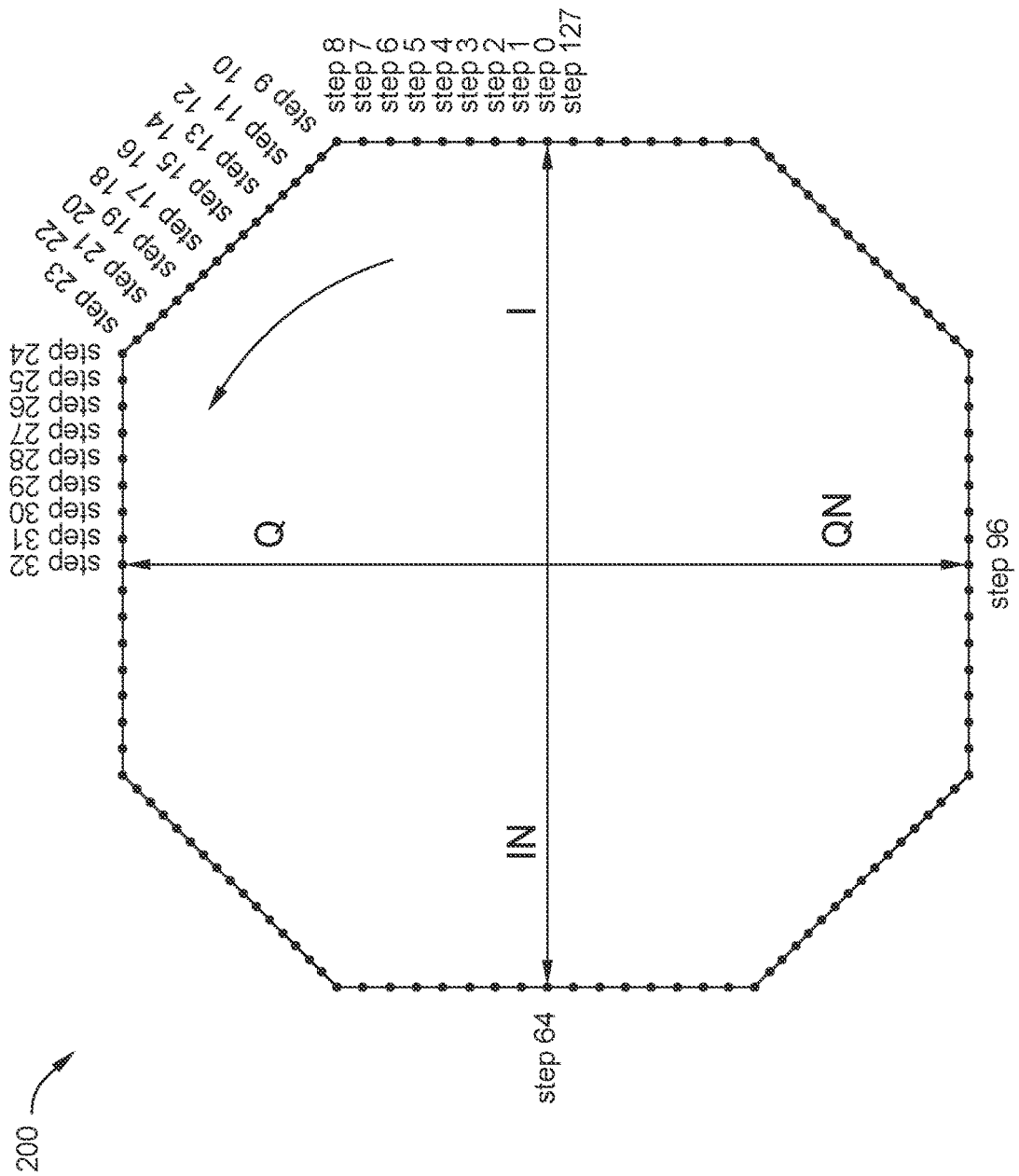
FIG. 2 illustrates an example phase diagram for the system of FIG. 1.

FIG. 2 illustrates an example phase diagram for the phase rotator 104 of the system 100 of FIG. 1. The phase diagram shows a 360-degree phase divided into steps. The phase adjuster 104 may divide the 360-degree phase into any suitable number of steps. In the example of FIG. 2, the phase rotator 104 divides the 360-degree phase into 128 steps. The phase rotator 104 may divide the 360-degree phase into more steps by using more interpolation branches and control bits 112. Generally, the phase rotator 104 adjusts which clock signals 108 are connected to a same set of active interpolation branches of the phase rotator 104 to vary the contributions of those clock signals 108 to the phrase of an adjusted clock signal 110. By varying the contribution of the clock signals 108, the phase rotator 104 adjusts the step of the phase diagram on which the phase of the adjusted clock signal 110 falls.

The phase diagram in FIG. 2 shows that the phase rotator 104 receives four clock signals. Using the example of FIG. 1, the phase rotator 104 may receive the clock signals 108A, 108B, 108C and 108D. The clock signal 108A has a 0-degree phase and is represented by the symbol 'I' in the phase diagram. The clock signal 108B has a 90-degree phase and is represented by the symbol 'Q' in the phase diagram. The clock signal 108C has a 180-degree phase and is represented by the symbol 'IN' in the phase diagram. The clock signal 108D has a 270-degree phase and is represented by the symbol 'QN' in the phase diagram. The phase rotator 104 adjusts the contribution of each of these clock signals 108 to the phase of a resulting adjusted clock signal 110 by varying which of these clock signals 108 is connected to a same set of active interpolation branches of the phase rotator 104. For example, the phase rotator 104 may produce an adjusted clock signal 110 with a 0-degrees phase by connecting the clock signal 108A to the interpolation branches of the phase rotator 104 and by disconnecting the clock signal 108C from the interpolation branches of the phase rotator 104, such that the contribution in the horizontal plane of the phase diagram is in the direction of I. Additionally, the phase rotator 104 may connect the clock signals 108B and 108D to the interpolation branches of the phase rotator 104 such that the clock signals 108B and 108D provide an equal contribution. In this example, the contributions of the clock signals 108B and 108D cancel each other out in the vertical plane of the phase diagram. When the contributions from these clock signals 108A, 108B, 108C, and 108D are summed together, the resulting phase is in the direction of I in the phase diagram. As a result, the adjusted clock signal 110 produced by the phase rotator 104 has a phase at step 0 and in the direction of I in the phase diagram.

The phase rotator 104 may rotate the phase of the adjusted clock signal 110 to another step in the phase diagram by changing which clock signals 108 are connected to the same set of active interpolation branches of the phase rotator 104. For example, if the control bits 112 from the controller 106 indicate to the phase rotator 104 that the adjusted clock signal 110 should be at step 1 instead of step 0, then the phase rotator 104 may disconnect the clock signal 108D from an interpolation branch in the phase rotator 104 and connect the clock signal 108B to that same interpolation branch. In this manner, the phase rotator 104 increases the contribution of the clock signal 108B and decreases the contribution of the clock signal 108D. As a result, the contribution in the vertical plane shifts slightly towards Q and away from QN. When the contributions are combined (e.g., summed or interpolated), the resulting phase of the adjusted clock signal 110 moves from step 0 to step 1. The phase rotator 104 may connect and/or disconnect clock signals 108 from the interpolation branches in the phase rotator 104 to move the phase of the adjusted clock signal 110 to any step in the phase diagram.

Figure 3:
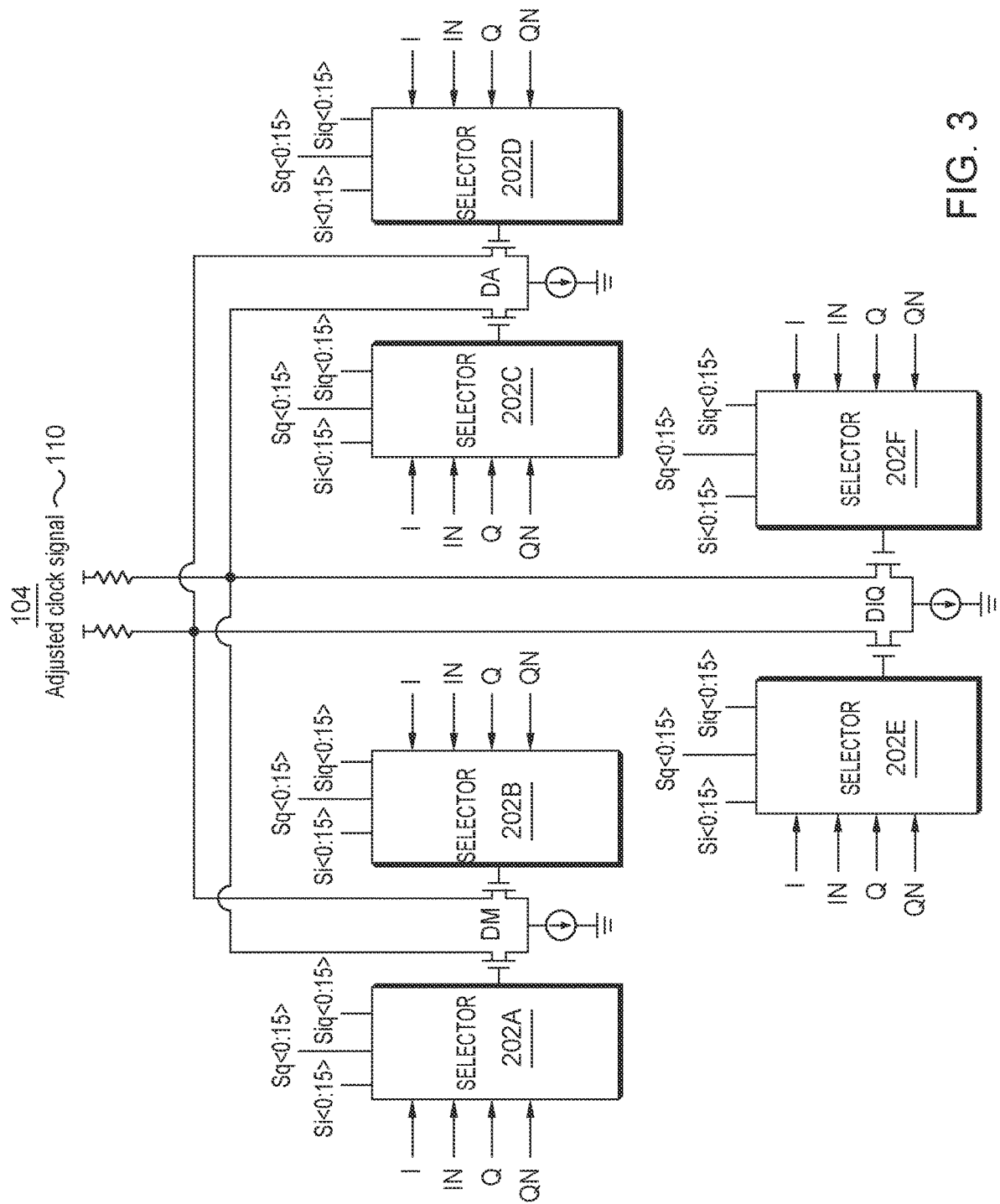
FIG. 3 illustrates an example phase rotator of the system of FIG. 1.

FIG. 3 illustrates an example phase rotator 104 of the system 100 of FIG. 1. As seen in FIG. 3, the phase rotator 104 includes interpolation branches DM, DA, and DIQ and selectors 202. Generally, these selectors 202 control which clock signal 108 is connected to an interpolation branch DM, DA, or DIQ. In particular embodiments, the phase rotator 104 adjusts or rotates the phase of an adjusted clock signal 110 by changing which clock signals 108 are connected to the interpolation branches DM, DA, and DIQ. DM, DA, and DIQ are active interpolation branches. Although the example phase rotator 104 of FIG. 3 includes three interpolation branches (DM, DA, and DIQ), the phase rotator 104 may include any number of interpolation branches that connect to any number of clock signals through any number of selectors 202.

Each of the interpolation branches DM, DA, and DIQ shown in FIG. 3 represent a collection of interpolation branches. For example, the interpolation branch DM may be a collection of sixteen individual interpolation branches that each receives one of the clock signals 108. As another example, the interpolation branch DA may be a collection of sixteen individual interpolation branches that each receives one of the clock signals 108. As yet another example, the interpolation branch DIQ may be a collection of sixteen individual interpolation branches that each receives a clock signal 108. The phase rotator 104 connects and disconnects clock signals 108 to these individual interpolation branches to vary the contribution of those clock signals to the phase of the adjusted clock signal 110. Although the example of FIG. 3 shows that the interpolation branches are made using a transistor pair, the interpolation branches may be implemented in any suitable manner. For example, the interpolation branches may include current-mode logic (CML) buffers or inverter buffers.

The selectors 202 include circuitry (e.g., analog, digital, and/or quantum logic circuits) that connect the clock signals 108 to the interpolation branches DM, DA, and DIQ based on received control bits 112. As seen in FIG. 3, each selector 202 receives the clock signals represented by the symbols I, IN, Q, and QN. Additionally, each selector 202 receives control signals represented by the symbols SI, SQ, and SIQ. Each of the control signals SI, SQ, and SIQ may include sixteen control bits 112. Based on the values of SI, SQ, and SIQ, each selector 202 connects one of the clock signals I, IN, Q, or QN to each interpolation branch that forms the interpolation branches DM, DA, and DIQ. By changing the values of the control signals SI, SQ, and SIQ, the selectors 202 may change which clock signal I, IN, Q, or QN is connected to the interpolation branches that form the interpolation branches DM, DA, and DIQ. The selectors 202 effectively behave as 4-to-1 multiplexors.

The interpolation branch DM is connected to the selectors 202A and 202B. The interpolation branch DA is connected to the selectors 202C and 202D. The interpolation branch DIQ is connected to the selectors 202E and 202F. Based on the values of SI, SQ, and SIQ, the individual interpolation branches that form the interpolation branches DM, DA, and DIQ are each connected to one of the clock signals I, IN, Q, or QN. When the values of SI, SQ, or SIQ change, some of the individual interpolation branches that form the interpolation branches DM, DA, and DIQ may be connected to a different clock signal I, IN, Q, or QN. The outputs of the interpolation branches DM, DA, and DIQ are summed to form the adjusted clock signal 110. The phase of the adjusted clock signal 110 may change based on which of the clock signals I, IN, Q, or QN are connected to the individual interpolation branches that form the interpolation branches DM, DA, and DIQ.

Using a previous example, if the adjusted clock signal 110 is to have a phase of 0 degrees, then the control bits SI, SQ, and SIQ may be set such that the clock signal I is connected to the individual interpolation branches that form the interpolation branches DM and DIQ. In other words, the control bits SI, SQ, and SIQ are set such that the selectors 202A, 202B, 202E, and 202F connect the clock signal I to the individual interpolation branches of the interpolation branches DM and DIQ. Additionally, the control bits SI, SQ, and SIQ may be set such that an equal number of individual interpolation branches that form the interpolation branches DA are connected to the clock signals Q and QN. As a result of these connections, the phase of the adjusted clock signal 110 has a phase in the horizontal plane directed in the direction of the clock signal I. Additionally, the phase of the adjusted clock signal 110 in the vertical plane has an equal contribution from the clock signals Q and QN, which cancel out the contribution in the vertical plane. As a result, the adjusted clock signal 110 has a phase in the direction of the clock signal I, or 0 degrees. If the controller 106 determines that the phase of the adjusted clock signal 110 should be rotated by one step, then the controller 106 adjusts the control bits SI, SQ, and SIQ such that the selectors 202C and 202D disconnect the clock signal QN from an individual interpolation branch of the interpolation branch DA and connect the clock signal Q to that individual interpolation branch. In this manner, the phase of the adjusted clock signal 110 in the vertical plane has a slightly larger contribution from the clock signal Q than the clock signal QN. As a result, the phase of the adjusted clock signal 110 rotates by one step.

Table 1 below shows the connections of the individual interpolation branches that form the interpolation branches DM, DA, and DIQ through the first 33 steps of the phase diagram of FIG. 2. A similar progression can be followed to progress through the other quadrants of the phase diagram. As seen in Table 1, steps 0 and 1 follow the description of the previous examples. Additionally, at step 9, the phase rotator 104 begins connecting the clock signal I to the individual interpolation branches of the interpolation branch DA and connecting the clock signal Q to the individual interpolation branches of the interpolation branches DM and DIQ. At step 25, the phase rotator 104 begins connecting the clock signal IN to the individual interpolation branches of the interpolation branch DA. Moreover, although not shown in Table 1, at step 64, the phase rotator 104 may connect the clock signal IN to the individual interpolation branches of the interpolation branches DM and DIQ and connect the same number of individual interpolation branches of the interpolation branch DA to the clock signals Q and QN. At step 96, the phase rotator 104 may connect the clock signal QN to the individual interpolation branches of the interpolation branches DM and DIQ and connect the same number of individual interpolation branches of the interpolation branch DA to the clock signals I and IN.

TABLE 1

| Step | Inputs | Connections |
|---|---|---|
| 0 | I | DM<0:15>, DIQ<0:15> |
|  | Q | DA<8:15> |
|  | IN | null |
|  | QN | DA<0:7> |
| 1 | I | DM<0:15>, DIQ<0:15> |
|  | Q | DA<7:15> |
|  | IN | null |
|  | QN | DA<0:6> |
| 2 | I | DM<0:15>, DIQ<0:15> |
|  | Q | DA<6:15> |
|  | IN | null |
|  | QN | DA<0:5> |
| 3 | I | DM<0:15>, DIQ<0:15> |
|  | Q | DA<5:15> |
|  | IN | null |
|  | QN | DA<0:4> |
| 4 | I | DM<0:15>, DIQ<0:15> |
|  | Q | DA<4:15> |
|  | IN | null |
|  | QN | DA<0:3> |
| 5 | I | DM<0:15>, DIQ<0:15> |
|  | Q | DA<3:15> |
|  | IN | null |
|  | QN | DA<0:2> |
| 6 | I | DM<0:15>, DIQ<0:15> |
|  | Q | DA<2:15> |
|  | IN | null |
|  | QN | DA<0:1> |
| 7 | I | DM<0:15>, DIQ<0:15> |
|  | Q | DA<1:15> |
|  | IN | null |
|  | QN | DA<0> |
| 8 | I | DM<0:15>, DIQ<0:15> |
|  | Q | DA<0:15> |
|  | IN | null |
|  | QN | null |
| 9 | I | DM<0:14>, DIQ<0:14>, DA<15> |
|  | Q | DA<0:14>, DIQ<15>, DM<15> |
|  | IN | null |
|  | QN | null |

TABLE 1-continued

| Step | Inputs | Connections |
|---|---|---|
| 10 | I | DM<0:13>, DIQ<0:13>, DA<14:15> |
|  | Q | DA<0:13>, DIQ<14:15> DM<14:15> |
|  | IN | null |
|  | QN | null |
| 11 | I | DM<0:12>, DIQ<0:12>, DA<13:15> |
|  | Q | DA<0:12>, DIQ<13:15> DM<13:15> |
|  | IN | null |
|  | QN | null |
| 12 | I | DM<0:11>, DIQ<0:11> DA<12:15> |
|  | Q | DA<0:11>, DIQ<12:15> DM<12:15> |
|  | IN | null |
|  | QN | null |
| 13 | I | DM<0:10>, DIQ<0:10>, DA<11:15> |
|  | Q | DA<0:10>, DIQ<11:15>, DM<11:15> |
|  | IN | null |
|  | QN | null |
| 14 | I | DM<0:9>, DIQ<0:9>, DA<10:15> |
|  | Q | DA<0:9>, DIQ<10:15> DM<10:15> |
|  | IN | null |
|  | QN | null |
| 15 | I | DM<0:8>, DIQ<0:8>, DA<9:15> |
|  | Q | DA<0:8>, DIQ<9:15>, DM<9:15> |
|  | IN | null |
|  | QN | null |
| 16 | I | DM<0:7>, DIQ<0:7>, DA<8:15> |
|  | Q | DA<0:7>, DIQ<8:15>, DM<8:15> |
|  | IN | null |
|  | QN | null |
| 17 | I | DM<0:6>, DIQ<0:6>, DA<7:15> |
|  | Q | DA<0:6>, DIQ<7:15>, DM<7:15> |
|  | IN | null |
|  | QN | null |
| 18 | I | DM<0:5>, DIQ<0:5>, DA<6:15> |
|  | Q | DA<0:5>, DIQ<6:15>, DM<6:15> |
|  | IN | null |
|  | QN | null |
| 19 | I | DM<0:4>, DIQ<0:4>, DA<5:15> |
|  | Q | DA<0:4>, DIQ<5:15>, DM<5:15> |
|  | IN | null |
|  | QN | null |
| 20 | I | DM<0:3>, DIQ<0:3>, DA<4:15> |
|  | Q | DA<0:3>, DIQ<4:15>, DM<4:15> |
|  | IN | null |
|  | QN | null |
| 21 | I | DM<0:2>, DIQ<0:2>, DA<3:15> |
|  | Q | DA<0:2>, DIQ<3:15>, DM<3:15> |
|  | IN | null |
|  | QN | null |
| 22 | I | DM<0:1>, DIQ<0:1>, DA<2:15> |
|  | Q | DA<0:1>, DIQ<2:15>, DM<2:15> |
|  | IN | null |
|  | QN | null |
| 23 | I | DM<0>, DIQ<0>, DA<1:15> |
|  | Q | DA<0>, DIQ<1:15>, DM<1:15> |
|  | IN | null |
|  | QN | null |
| 24 | I | DA<0:15> |
|  | Q | DIQ<0:15>, DM<0:15> |
|  | IN | null |
|  | QN | null |
| 25 | I | DA<0:14> |
|  | Q | DIQ<0:15>, DM<0:15> |
|  | IN | DA<15> |
|  | QN | null |
| 26 | I | DA<0:13> |
|  | Q | DIQ<0:15>, DM<0:15> |
|  | IN | DA<14:15> |
|  | QN | null |

TABLE 1-continued

| Step | Inputs | Connections |
|---|---|---|
| 27 | I | DA<0:12> |
|  | Q | DIQ<0:15>, DM<0:15> |
|  | IN | DA<13:15> |
|  | QN | null |
| 28 | I | DA<0:11> |
|  | Q | DIQ<0:15>, DM<0:15> |
|  | IN | DA<12:15> |
|  | QN | null |
| 29 | I | DA<0:10> |
|  | Q | DIQ<0:15>, DM<0:15> |
|  | IN | DA<11:15> |
|  | QN | null |
| 30 | I | DA<0:9> |
|  | Q | DIQ<0:15>, DM<0:15> |
|  | IN | DA<10:15> |
|  | QN | null |
| 31 | I | DA<0:8> |
|  | Q | DIQ<0:15>, DM<0:15> |
|  | IN | DA<9:15> |
|  | QN | null |
| 32 | I | DA<0:7> |
|  | Q | DIQ<0:15>, DM<0:15> |
|  | IN | DA<8:15> |
|  | QN | null |

Table 2 below shows an example progression of the control bits SI, SQ, and SIQ for the 128 steps of the phase diagram of FIG. 2.

TABLE 2

| Step | SI<0:15> | SQ<0:15> | SIQ<0:15> |
|---|---|---|---|
| 0 | 0000-0000-0000-0000 | 1111-1111-0000-0000 | 0000-0000-0000-0000 |
| 1 | 0000-0000-0000-0000 | 1111-1110-0000-0000 | 0000-0000-0000-0000 |
| 2 | 0000-0000-0000-0000 | 1111-1100-0000-0000 | 0000-0000-0000-0000 |
| 3 | 0000-0000-0000-0000 | 1111-1000-0000-0000 | 0000-0000-0000-0000 |
| 4 | 0000-0000-0000-0000 | 1111-0000-0000-0000 | 0000-0000-0000-0000 |
| 5 | 0000-0000-0000-0000 | 1110-0000-0000-0000 | 0000-0000-0000-0000 |
| 6 | 0000-0000-0000-0000 | 1100-0000-0000-0000 | 0000-0000-0000-0000 |
| 7 | 0000-0000-0000-0000 | 1000-0000-0000-0000 | 0000-0000-0000-0000 |
| 8 | 0000-0000-0000-0000 | 0000-0000-0000-0000 | 0000-0000-0000-0000 |
| 9 | 0000-0000-0000-0000 | 0000-0000-0000-0000 | 0000-0000-0000-0001 |
| 10 | 0000-0000-0000-0000 | 0000-0000-0000-0000 | 0000-0000-0000-0011 |
| 11 | 0000-0000-0000-0000 | 0000-0000-0000-0000 | 0000-0000-0000-0111 |
| 12 | 0000-0000-0000-0000 | 0000-0000-0000-0000 | 0000-0000-0000-1111 |
| 13 | 0000-0000-0000-0000 | 0000-0000-0000-0000 | 0000-0000-0001-1111 |
| 14 | 0000-0000-0000-0000 | 0000-0000-0000-0000 | 0000-0000-0011-1111 |
| 15 | 0000-0000-0000-0000 | 0000-0000-0000-0000 | 0000-0000-0111-1111 |
| 16 | 0000-0000-0000-0000 | 0000-0000-0000-0000 | 0000-0000-1111-1111 |
| 17 | 0000-0000-0000-0000 | 0000-0000-0000-0000 | 0000-0001-1111-1111 |
| 18 | 0000-0000-0000-0000 | 0000-0000-0000-0000 | 0000-0011-1111-1111 |
| 19 | 0000-0000-0000-0000 | 0000-0000-0000-0000 | 0000-0111-1111-1111 |
| 20 | 0000-0000-0000-0000 | 0000-0000-0000-0000 | 0000-1111-1111-1111 |
| 21 | 0000-0000-0000-0000 | 0000-0000-0000-0000 | 0001-1111-1111-1111 |
| 22 | 0000-0000-0000-0000 | 0000-0000-0000-0000 | 0011-1111-1111-1111 |
| 23 | 0000-0000-0000-0000 | 0000-0000-0000-0000 | 0111-1111-1111-1111 |
| 24 | 0000-0000-0000-0000 | 0000-0000-0000-0000 | 1111-1111-1111-1111 |
| 25 | 0000-0000-0000-0001 | 0000-0000-0000-0000 | 1111-1111-1111-1111 |
| 26 | 0000-0000-0000-0011 | 0000-0000-0000-0000 | 1111-1111-1111-1111 |
| 27 | 0000-0000-0000-0111 | 0000-0000-0000-0000 | 1111-1111-1111-1111 |
| 28 | 0000-0000-0000-1111 | 0000-0000-0000-0000 | 1111-1111-1111-1111 |
| 29 | 0000-0000-0001-1111 | 0000-0000-0000-0000 | 1111-1111-1111-1111 |
| 30 | 0000-0000-0011-1111 | 0000-0000-0000-0000 | 1111-1111-1111-1111 |
| 31 | 0000-0000-0111-1111 | 0000-0000-0000-0000 | 1111-1111-1111-1111 |
| 32 | 0000-0000-1111-1111 | 0000-0000-0000-0000 | 1111-1111-1111-1111 |
| 33 | 0000-0001-1111-1111 | 0000-0000-0000-0000 | 1111-1111-1111-1111 |
| 34 | 0000-0011-1111-1111 | 0000-0000-0000-0000 | 1111-1111-1111-1111 |
| 35 | 0000-0111-1111-1111 | 0000-0000-0000-0000 | 1111-1111-1111-1111 |
| 36 | 0000-1111-1111-1111 | 0000-0000-0000-0000 | 1111-1111-1111-1111 |
| 37 | 0001-1111-1111-1111 | 0000-0000-0000-0000 | 1111-1111-1111-1111 |
| 38 | 0011-1111-1111-1111 | 0000-0000-0000-0000 | 1111-1111-1111-1111 |
| 39 | 0111-1111-1111-1111 | 0000-0000-0000-0000 | 1111-1111-1111-1111 |
| 40 | 1111-1111-1111-1111 | 0000-0000-0000-0000 | 1111-1111-1111-1111 |
| 41 | 1111-1111-1111-1111 | 0000-0000-0000-0000 | 1111-1111-1111-1110 |
| 42 | 1111-1111-1111-1111 | 0000-0000-0000-0000 | 1111-1111-1111-1100 |
| 43 | 1111-1111-1111-1111 | 0000-0000-0000-0000 | 1111-1111-1111-1000 |
| 44 | 1111-1111-1111-1111 | 0000-0000-0000-0000 | 1111-1111-1111-0000 |
| 45 | 1111-1111-1111-1111 | 0000-0000-0000-0000 | 1111-1111-1110-0000 |
| 46 | 1111-1111-1111-1111 | 0000-0000-0000-0000 | 1111-1111-1100-0000 |
| 47 | 1111-1111-1111-1111 | 0000-0000-0000-0000 | 1111-1111-1000-0000 |
| 48 | 1111-1111-1111-1111 | 0000-0000-0000-0000 | 1111-1111-0000-0000 |
| 49 | 1111-1111-1111-1111 | 0000-0000-0000-0000 | 1111-1110-0000-0000 |
| 50 | 1111-1111-1111-1111 | 0000-0000-0000-0000 | 1111-1100-0000-0000 |
| 51 | 1111-1111-1111-1111 | 0000-0000-0000-0000 | 1111-1000-0000-0000 |
| 52 | 1111-1111-1111-1111 | 0000-0000-0000-0000 | 1111-0000-0000-0000 |
| 53 | 1111-1111-1111-1111 | 0000-0000-0000-0000 | 1110-0000-0000-0000 |
| 54 | 1111-1111-1111-1111 | 0000-0000-0000-0000 | 1100-0000-0000-0000 |
| 55 | 1111-1111-1111-1111 | 0000-0000-0000-0000 | 1000-0000-0000-0000 |
| 56 | 1111-1111-1111-1111 | 0000-0000-0000-0000 | 0000-0000-0000-0000 |

TABLE 2-continued

| Step | SI<0:15> | SQ<0:15> | SIQ<0:15> |
|---|---|---|---|
| 57 | 1111-1111-1111-1111 | 0000-0000-0000-0001 | 0000-0000-0000-0000 |
| 58 | 1111-1111-1111-1111 | 0000-0000-0000-0011 | 0000-0000-0000-0000 |
| 59 | 1111-1111-1111-1111 | 0000-0000-0000-0111 | 0000-0000-0000-0000 |
| 60 | 1111-1111-1111-1111 | 0000-0000-0000-1111 | 0000-0000-0000-0000 |
| 61 | 1111-1111-1111-1111 | 0000-0000-0001-1111 | 0000-0000-0000-0000 |
| 62 | 1111-1111-1111-1111 | 0000-0000-0011-1111 | 0000-0000-0000-0000 |
| 63 | 1111-1111-1111-1111 | 0000-0000-0111-1111 | 0000-0000-0000-0000 |
| 64 | 1111-1111-1111-1111 | 0000-0000-1111-1111 | 0000-0000-0000-0000 |
| 65 | 1111-1111-1111-1111 | 0000-0001-1111-1111 | 0000-0000-0000-0000 |
| 66 | 1111-1111-1111-1111 | 0000-0011-1111-1111 | 0000-0000-0000-0000 |
| 67 | 1111-1111-1111-1111 | 0000-0111-1111-1111 | 0000-0000-0000-0000 |
| 68 | 1111-1111-1111-1111 | 0000-1111-1111-1111 | 0000-0000-0000-0000 |
| 69 | 1111-1111-1111-1111 | 0001-1111-1111-1111 | 0000-0000-0000-0000 |
| 70 | 1111-1111-1111-1111 | 0011-1111-1111-1111 | 0000-0000-0000-0000 |
| 71 | 1111-1111-1111-1111 | 0111-1111-1111-1111 | 0000-0000-0000-0000 |
| 72 | 1111-1111-1111-1111 | 1111-1111-1111-1111 | 0000-0000-0000-0000 |
| 73 | 1111-1111-1111-1111 | 1111-1111-1111-1111 | 0000-0000-0000-0001 |
| 74 | 1111-1111-1111-1111 | 1111-1111-1111-1111 | 0000-0000-0000-0011 |
| 75 | 1111-1111-1111-1111 | 1111-1111-1111-1111 | 0000-0000-0000-0111 |
| 76 | 1111-1111-1111-1111 | 1111-1111-1111-1111 | 0000-0000-0000-1111 |
| 77 | 1111-1111-1111-1111 | 1111-1111-1111-1111 | 0000-0000-0001-1111 |
| 78 | 1111-1111-1111-1111 | 1111-1111-1111-1111 | 0000-0000-0011-1111 |
| 79 | 1111-1111-1111-1111 | 1111-1111-1111-1111 | 0000-0000-0111-1111 |
| 80 | 1111-1111-1111-1111 | 1111-1111-1111-1111 | 0000-0000-1111-1111 |
| 81 | 1111-1111-1111-1111 | 1111-1111-1111-1111 | 0000-0001-1111-1111 |
| 82 | 1111-1111-1111-1111 | 1111-1111-1111-1111 | 0000-0011-1111-1111 |
| 83 | 1111-1111-1111-1111 | 1111-1111-1111-1111 | 0000-0111-1111-1111 |
| 84 | 1111-1111-1111-1111 | 1111-1111-1111-1111 | 0000-1111-1111-1111 |
| 85 | 1111-1111-1111-1111 | 1111-1111-1111-1111 | 0001-1111-1111-1111 |
| 86 | 1111-1111-1111-1111 | 1111-1111-1111-1111 | 0011-1111-1111-1111 |
| 87 | 1111-1111-1111-1111 | 1111-1111-1111-1111 | 0111-1111-1111-1111 |
| 88 | 1111-1111-1111-1111 | 1111-1111-1111-1111 | 1111-1111-1111-1111 |
| 89 | 1111-1111-1111-1110 | 1111-1111-1111-1111 | 1111-1111-1111-1111 |
| 90 | 1111-1111-1111-1100 | 1111-1111-1111-1111 | 1111-1111-1111-1111 |
| 91 | 1111-1111-1111-1000 | 1111-1111-1111-1111 | 1111-1111-1111-1111 |
| 92 | 1111-1111-1111-0000 | 1111-1111-1111-1111 | 1111-1111-1111-1111 |
| 93 | 1111-1111-1110-0000 | 1111-1111-1111-1111 | 1111-1111-1111-1111 |
| 94 | 1111-1111-1100-0000 | 1111-1111-1111-1111 | 1111-1111-1111-1111 |
| 95 | 1111-1111-1000-0000 | 1111-1111-1111-1111 | 1111-1111-1111-1111 |
| 96 | 1111-1111-0000-0000 | 1111-1111-1111-1111 | 1111-1111-1111-1111 |
| 97 | 1111-1110-0000-0000 | 1111-1111-1111-1111 | 1111-1111-1111-1111 |
| 98 | 1111-1100-0000-0000 | 1111-1111-1111-1111 | 1111-1111-1111-1111 |
| 99 | 1111-1000-0000-0000 | 1111-1111-1111-1111 | 1111-1111-1111-1111 |
| 100 | 1111-0000-0000-0000 | 1111-1111-1111-1111 | 1111-1111-1111-1111 |
| 101 | 1110-0000-0000-0000 | 1111-1111-1111-1111 | 1111-1111-1111-1111 |
| 102 | 1100-0000-0000-0000 | 1111-1111-1111-1111 | 1111-1111-1111-1111 |
| 103 | 1000-0000-0000-0000 | 1111-1111-1111-1111 | 1111-1111-1111-1111 |
| 104 | 0000-0000-0000-0000 | 1111-1111-1111-1111 | 1111-1111-1111-1111 |
| 105 | 0000-0000-0000-0000 | 1111-1111-1111-1111 | 1111-1111-1111-1110 |
| 106 | 0000-0000-0000-0000 | 1111-1111-1111-1111 | 1111-1111-1111-1100 |
| 107 | 0000-0000-0000-0000 | 1111-1111-1111-1111 | 1111-1111-1111-1000 |
| 108 | 0000-0000-0000-0000 | 1111-1111-1111-1111 | 1111-1111-1111-0000 |
| 109 | 0000-0000-0000-0000 | 1111-1111-1111-1111 | 1111-1111-1110-0000 |
| 110 | 0000-0000-0000-0000 | 1111-1111-1111-1111 | 1111-1111-1100-0000 |
| 111 | 0000-0000-0000-0000 | 1111-1111-1111-1111 | 1111-1111-1000-0000 |
| 112 | 0000-0000-0000-0000 | 1111-1111-1111-1111 | 1111-1111-0000-0000 |
| 113 | 0000-0000-0000-0000 | 1111-1111-1111-1111 | 1111-1110-0000-0000 |
| 114 | 0000-0000-0000-0000 | 1111-1111-1111-1111 | 1111-1100-0000-0000 |
| 115 | 0000-0000-0000-0000 | 1111-1111-1111-1111 | 1111-1000-0000-0000 |
| 116 | 0000-0000-0000-0000 | 1111-1111-1111-1111 | 1111-0000-0000-0000 |
| 117 | 0000-0000-0000-0000 | 1111-1111-1111-1111 | 1110-0000-0000-0000 |
| 118 | 0000-0000-0000-0000 | 1111-1111-1111-1111 | 1100-0000-0000-0000 |
| 119 | 0000-0000-0000-0000 | 1111-1111-1111-1111 | 1000-0000-0000-0000 |
| 120 | 0000-0000-0000-0000 | 1111-1111-1111-1111 | 0000-0000-0000-0000 |
| 121 | 0000-0000-0000-0000 | 1111-1111-1111-1110 | 0000-0000-0000-0000 |
| 122 | 0000-0000-0000-0000 | 1111-1111-1111-1100 | 0000-0000-0000-0000 |
| 123 | 0000-0000-0000-0000 | 1111-1111-1111-1000 | 0000-0000-0000-0000 |
| 124 | 0000-0000-0000-0000 | 1111-1111-1111-0000 | 0000-0000-0000-0000 |
| 125 | 0000-0000-0000-0000 | 1111-1111-1110-0000 | 0000-0000-0000-0000 |
| 126 | 0000-0000-0000-0000 | 1111-1111-1100-0000 | 0000-0000-0000-0000 |
| 127 | 0000-0000-0000-0000 | 1111-1111-1000-0000 | 0000-0000-0000-0000 |

As seen in Tables 1 and 2, to rotate the phase of the adjusted clock signal 110, the phase rotator 104 connects different clock signals to the individual interpolation branches of the interpolation branches DM, DA, and DIQ. As a result, the same interpolation branches are used regardless of the phase of the adjusted clock signal 110. In this manner, the phase rotator 104 has improved linearity relative to conventional designs, in particular embodiments. It is important to note that Tables 1 and 2 are provided merely as an example operation of the phase rotator 104. As discussed previously, the phase rotator 104 may include any suitable number of interpolation branches and selectors 202 that connect to any suitable number of clock signals based on any suitable number of control bits. Additionally, the control bit patterns shown in Tables 1 and 2 may be changed or adjusted in any suitable manner to produce output signals with any desired phase. Stated differently, the implementation shown in Tables 1 and 2 is only an example implementation.

Figure 4:
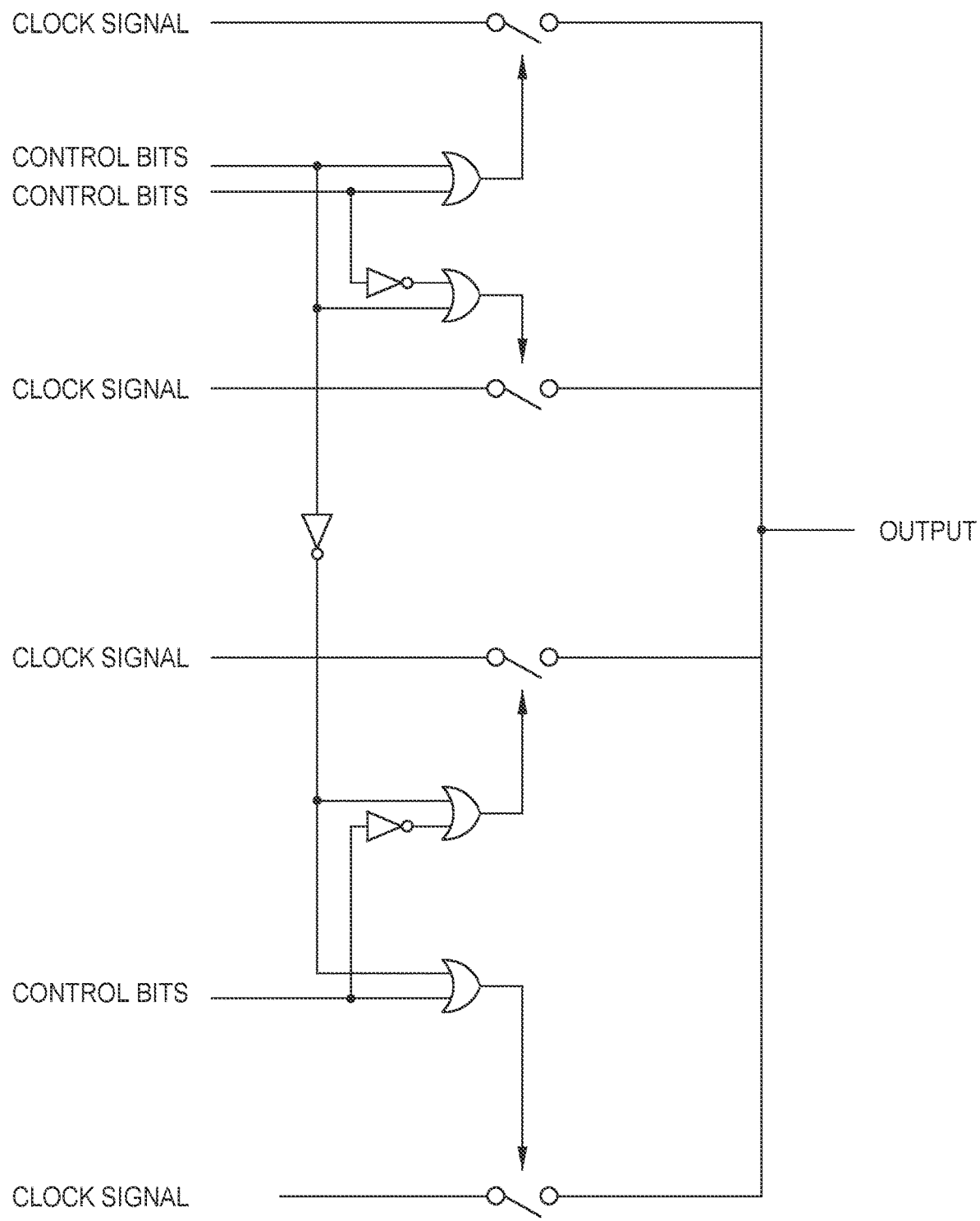
FIG. 4 illustrates an example selector of the phase rotator of FIG. 3.

FIG. 4 illustrates an example selector 202 in the phase rotator 104 of FIG. 3. As seen in the example of FIG. 4, the selector 202 includes digital logic circuit elements that control certain switches in the selector 202 (e.g., a T-gate array). The control bits are connected to the inputs of the digital logic circuit elements and the clock signals are connected to the inputs of the switches. The control bits thus control which switches are open and which switches are closed. The output of the selector 202 is the output of one or more closed switches. The design of the selector 202 shown in FIG. 4 is provided as an example. The selector 202 may be implemented in any suitable manner.

Figure 5:
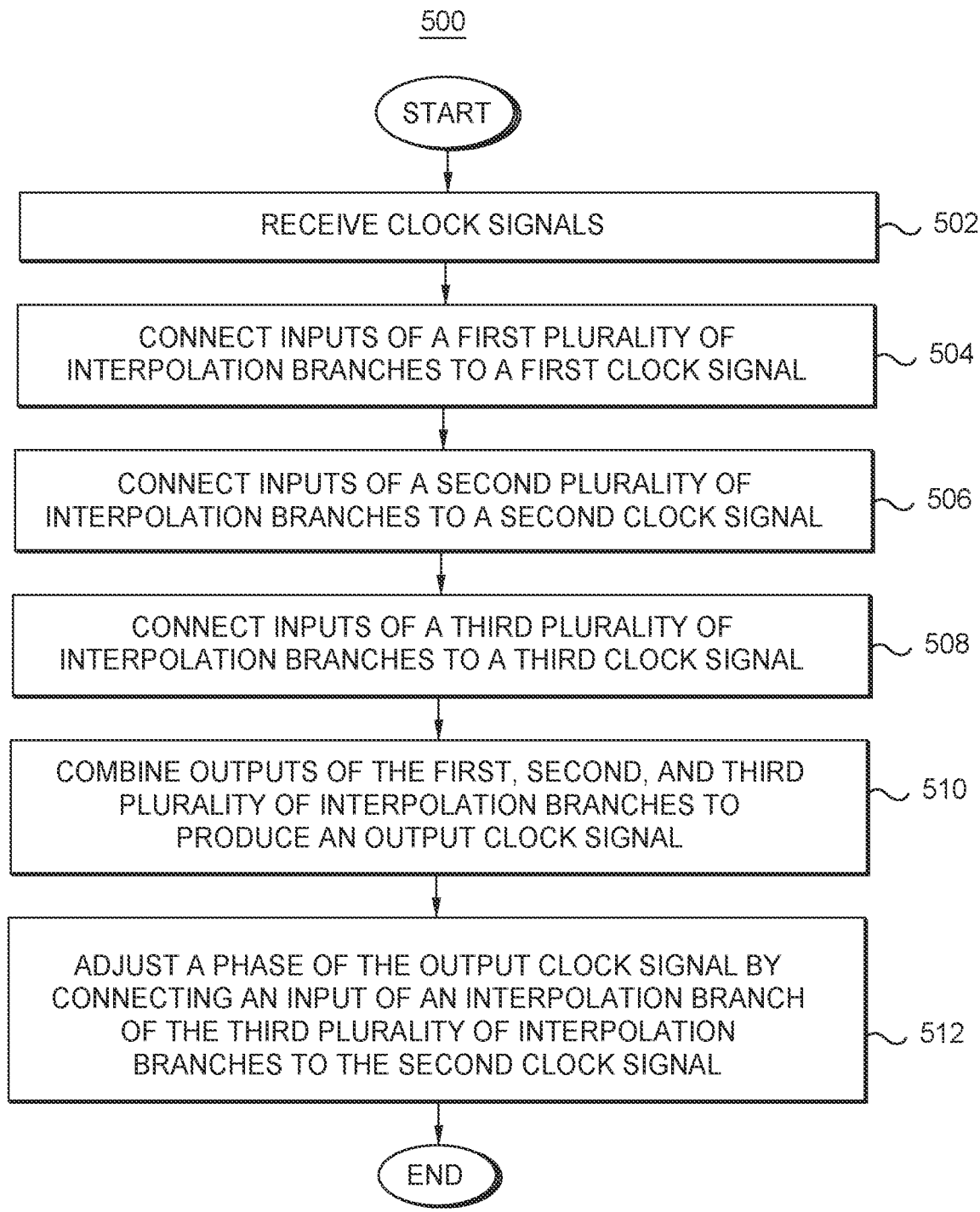
FIG. 5 is a flowchart of an example method in the system of FIG. 1.

FIG. 5 is a flowchart of an example method 500 in the system 100 of FIG. 1. The phase rotator 104 may perform the method 500. In particular embodiments, by performing the method 500, the phase rotator 104 rotates the phase of an adjusted clock signal 110.

In block 502, the phase rotator 104 receives clock signals 108. The clock signals 108 may have different phases relative to one another. The phase rotator 104 may connect these clock signals 108 to the interpolation branches within the phase rotator 104 to produce an adjusted clock signal 110 with a particular phase.

In block 504, the phase rotator 104 connects inputs of a first plurality of interpolation branches to a first clock signal 108. For example, the phase rotator 104 may connect inputs of the individual interpolation branches that form an interpolation branch DM and/or an interpolation branch DIQ to a clock signal I. In block 506, the phase rotator 104 connects inputs of a second plurality of interpolation branches to a second clock signal 108. For example, the phase rotator 104 may connect a number of individual interpolation branches of an interpolation branch DA to a clock signal Q. In block 508, the phase rotator 104 connects inputs of a third plurality of interpolation branches to a third clock signal 108. For example, the phase rotator 104 may connect a number of individual interpolation branches of the interpolation branch DA to a clock signal QN. By varying the number of interpolation branches that are connected to the second and third clock signals, the phase rotator 104 may adjust the contribution from the second clock signal and the third clock signal to the phase of the adjusted clock signal 110. For example, if the same number of interpolation branches are connected to the second and third clock signals, then the contribution from the second clock signal and the third clock signal will be equal. If the second clock signal is Q and the third clock signal is QN, then these contributions will cancel each other out.

In block 510, the phase rotator 104 combines outputs of the first, second, and third plurality of interpolation branches to produce an output clock signal. For example, the phase rotator 104 may combine the outputs of the interpolation branch DM, the interpolation branch DA, and the interpolation branch DIQ to produce an adjusted clock signal 110 with a particular phase.

In block 512, the phase rotator 104 adjusts a phase of the output clock signal by connecting an input of an interpolation branch of the third plurality of interpolation branches to the second clock signal. For example, the phase rotator 104 may disconnect the clock signal QN from an individual interpolation branch of the interpolation branch DA and connect that individual interpolation branch to the clock signal Q. As a result, the contribution of the clock signal Q to the phase of the output clock signal is increased and the contribution of the clock signal QN to the phase of the output clock signal is decreased. The phase rotator 104 may continue to adjust or rotate the phase of the output clock signal by changing which clock signals are connected to the interpolation branches of the phase rotator 104.

Figure 6:
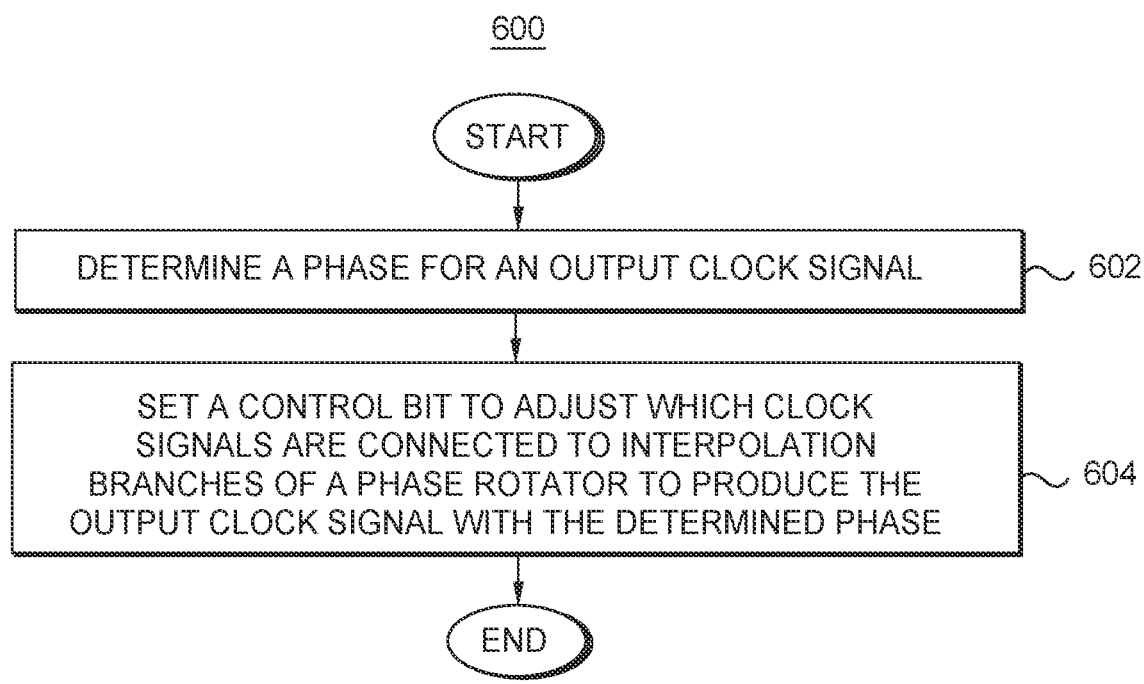
FIG. 6 is a flowchart of an example method in the system of FIG. 1.

FIG. 6 is a flowchart of an example method 600 in the system 100 of FIG. 1. The controller 106 may perform the method 600 in particular embodiments. By performing the method 600, the controller 106 sets control bits 112 that are used to adjust or rotate the phase of an adjusted clock signal 110.

In block 602, the controller 106 determines a phase for an output clock signal. The controller 106 may determine the phase based on any suitable information. For example, the controller 106 may determine that a sampler 102 should sample a data signal 118 at particular points in time. The controller 106 may then determine that the output clock signal should have a particular phase for the sampler 102 to sample the data signal 118 at the particular points in time.

In block 604, the controller 106 sets a control bit 112 to adjust which clock signals 108 are connected to which interpolation branches of a phase rotator 104 to produce the output clock signal with the determined phase. By setting the control bit 112, the controller 106 may cause a clock signal to be disconnected from an interpolation branch in the phase rotator and for that interpolation branch to be connected to a different clock signal. As a result, the contributions from these clock signals to the phase of the output clock signal is adjusted, which adjusts or rotates the phase of the output clock signal.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method comprising:
connecting inputs of a first plurality of interpolation branches to a first clock signal;
connecting inputs of a second plurality of interpolation branches to a second clock signal;
connecting inputs of a third plurality of interpolation branches to a third clock signal;
combining outputs of the first plurality of interpolation branches, the second plurality of interpolation branches, and the third plurality of interpolation branches to produce an output clock signal; and
adjusting a phase of the output clock signal by connecting an input of an interpolation branch of the third plurality of interpolation branches to the second clock signal.

2. The method of claim 1, further comprising adjusting the phase of the output clock signal by connecting an input of an interpolation branch of the second plurality of interpolation branches to the first clock signal.

3. The method of claim 1, further comprising connecting inputs of a fourth plurality of interpolation branches to the first clock signal, wherein producing the output clock signal comprises combining outputs of the first plurality of interpolation branches, the second plurality of interpolation branches, the third plurality of interpolation branches, and the fourth plurality of interpolation branches.

4. The method of claim 3, further comprising adjusting the phase of the output clock signal by connecting an input of an interpolation branch of the fourth plurality of interpolation branches to the second clock signal and by connecting an input of an interpolation branch of the first plurality of interpolation branches to the second clock signal.

5. The method of claim 1, wherein the second clock signal is 180 degrees out of phase with the third clock signal.

6. The method of claim 1, further comprising adjusting the phase of the output clock signal by connecting an input of an interpolation branch of the first plurality of interpolation branches to a fourth clock signal.

7. The method of claim 1, further comprising sampling a data signal based on the output clock signal.

8. A phase rotator comprising:
a first plurality of interpolation branches;
a first selector circuit connected to the first plurality of interpolation branches, the first selector circuit configured to connect inputs of the first plurality of interpolation branches to a first clock signal;
a second plurality of interpolation branches;
a third plurality of interpolation branches;
a second selector circuit connected to the second plurality of interpolation branches and the third plurality of interpolation branches, the second selector circuit configured to:
connect inputs of the second plurality of interpolation branches to a second clock signal;
connect inputs of the third plurality of interpolation branches to a third clock signal, wherein outputs of the first plurality of interpolation branches, the second plurality of interpolation branches, and the third plurality of interpolation branches are combined to produce an output clock signal; and
adjust a phase of the output clock signal by connecting an input of an interpolation branch of the third plurality of interpolation branches to the second clock signal.

9. The phase rotator of claim 8, wherein the second selector circuit is further configured to adjust the phase of the output clock signal by connecting an input of an interpolation branch of the second plurality of interpolation branches to the first clock signal.

10. The phase rotator of claim 8, further comprising:
a fourth plurality of interpolation branches; and
a third selector circuit connected to the fourth plurality of interpolation branches, the third selector circuit configured to connect inputs of the fourth plurality of interpolation branches to the first clock signal, wherein outputs of the first plurality of interpolation branches, the second plurality of interpolation branches, the third plurality of interpolation branches, and the fourth plurality of interpolation branches are combined to produce the output clock signal.

11. The phase rotator of claim 10, wherein the third selector circuit is further configured to adjust the phase of the output clock signal by connecting an input of an interpolation branch of the fourth plurality of interpolation branches to the second clock signal and wherein the first selector circuit is configured to adjust the phase of the output clock signal by connecting an input of an interpolation branch of the first plurality of interpolation branches to the second clock signal.

12. The phase rotator of claim 8, wherein the second clock signal is 180 degrees out of phase with the third clock signal.

13. The phase rotator of claim 8, wherein the first selector circuit is further configured to adjust the phase of the output clock signal by connecting an input of an interpolation branch of the first plurality of interpolation branches to a fourth clock signal of the plurality of clock signals.

14. The phase rotator of claim 8, wherein a data signal is sampled based on the output clock signal.

15. A method comprising:
determining a phase for an output clock signal;
setting control bits based on the phase for the output clock signal, wherein:
inputs of a first plurality of interpolation branches are connected to a first clock signal based on the control bits;
inputs of a second plurality of interpolation branches are connected to a second clock signal based on the control bits;
inputs of a third plurality of interpolation branches are connected to a third clock signal based on the control bits; and
outputs of the first plurality of interpolation branches, the second plurality of interpolation branches, and the third plurality of interpolation branches are combined to produce the output clock signal with the determined phase; and
adjusting the control bits to connect an input of an interpolation branch of the third plurality of interpolation branches to the second clock signal to adjust a phase of the output clock signal.

16. The method of claim 15, further comprising adjusting the control bits to connect an input of an interpolation branch of the second plurality of interpolation branches to the first clock signal to adjust a phase of the output clock signal.

17. The method of claim 15, wherein inputs of a fourth plurality of interpolation branches are connected to the first clock signal based on the control bits, wherein outputs of the first plurality of interpolation branches, the second plurality of interpolation branches, the third plurality of interpolation branches, and the fourth plurality of interpolation branches are combined to produce the output clock signal.

18. The method of claim 17, further comprising adjusting the control bits to connect an input of an interpolation branch of the fourth plurality of interpolation branches to the second clock signal and to connect an input of an interpolation branch of the first plurality of interpolation branches to the second clock signal to adjust a phase of the output clock signal.

19. The method of claim 15, further comprising adjusting the control bits to connect an input of an interpolation branch of the first plurality of interpolation branches to a fourth clock signal to adjust the phase of the output clock signal.

\* \* \* \* \*